US008450212B2

(12) United States Patent
Angyal et al.

(10) Patent No.: US 8,450,212 B2
(45) Date of Patent: May 28, 2013

(54) METHOD OF REDUCING CRITICAL DIMENSION PROCESS BIAS DIFFERENCES BETWEEN NARROW AND WIDE DAMASCENE WIRES

(75) Inventors: Matthew S. Angyal, Stormville, NY (US); Oluwafemi O. Ogunsola, Hopewell Junction, NY (US); Hakeem B. Akinmade-Yusuff, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 13/170,621

(22) Filed: Jun. 28, 2011

(65) Prior Publication Data
US 2013/0005147 A1 Jan. 3, 2013

(51) Int. Cl.
*H01L 21/311* (2006.01)

(52) U.S. Cl.
USPC ............ 438/696; 438/700; 438/710; 438/725

(58) Field of Classification Search
USPC .................................. 438/696, 700, 710, 725
See application file for complete search history.

(56) References Cited

U.S. PATENT DOCUMENTS

| 5,728,619 | A | 3/1998 | Tsai et al. | |
|---|---|---|---|---|
| 6,399,483 | B1 * | 6/2002 | Liu et al. | 438/638 |
| 6,514,867 | B1 | 2/2003 | Hui et al. | |
| 6,649,531 | B2 | 11/2003 | Cote et al. | |
| 6,660,646 | B1 | 12/2003 | Elmadjian | |
| 6,849,531 | B1 | 2/2005 | Lin et al. | |
| 6,869,857 | B2 | 3/2005 | Dai et al. | |
| 7,541,291 | B2 | 6/2009 | Kang et al. | |
| 7,544,623 | B2 | 6/2009 | Chou et al. | |
| 7,695,632 | B2 | 4/2010 | Lee et al. | |
| 7,785,753 | B2 | 8/2010 | Kim et al. | |
| 2002/0108929 | A1 * | 8/2002 | Ho et al. | 216/58 |
| 2003/0100190 | A1 * | 5/2003 | Cote et al. | 438/710 |
| 2005/0200026 | A1 | 9/2005 | Liaw | |
| 2006/0177990 | A1 * | 8/2006 | Beyer et al. | 438/421 |
| 2008/0166870 | A1 * | 7/2008 | Huang et al. | 438/619 |
| 2009/0107954 | A1 | 4/2009 | Feng et al. | |
| 2010/0323514 | A1 * | 12/2010 | Isobayashi et al. | 438/618 |
| 2011/0079907 | A1 * | 4/2011 | Farooq et al. | 257/751 |

OTHER PUBLICATIONS

Darnon et al., Patterning of porous SiOCH using an organic mask: Comparison with a metallic masking strategy, J. Vac. Sci. Technol. B 28(1), Jan./Feb. 2010, 1071-1023/2010/28(1)/149/8, copyright American Vacuum Society, pp. 149-156.

Wistrom et al., Integrating Cr and MoSi etch for optimal photomask critical dimension uniformity and phase uniformity, Photomask Technology 2008, edited by Hiroichi Kawahira, Larry S. Zurbrick, Proc. of SPIE vol. 7122, 71220F copyright 2008 SPIE CCC code: 0277-786X/08 doi: 10.1117/12.801570, pp. 71220F-1-71220F9.

* cited by examiner

*Primary Examiner* — Binh X Tran
(74) *Attorney, Agent, or Firm* — Schmeiser, Olsen & Watts; Wenjie Li

(57) ABSTRACT

A method including forming an organic polymer layer (OPL) on a substrate; forming a patterned photoresist layer having a first opening and a second opening over the OPL, the second opening wider than the first opening; performing a first reactive ion etch (RIE) to form a first trench and a second trench in the organic layer, the second trench wider than the first trench, the first trench extending into but not through the organic polymer layer, the second trench extending through the OPL to the substrate, the first RIE forming a first polymer layer on sidewalls of the first trench and a second polymer layer on sidewalls of the second trench, the second polymer layer thicker than the first polymer layer; and performing a second RIE to extend the first trench through the OPL to the substrate, the second RIE removing the second polymer layer from sidewalls of the second trench.

25 Claims, 9 Drawing Sheets

METHOD OF REDUCING CRITICAL DIMENSION PROCESS BIAS DIFFERENCES BETWEEN NARROW AND WIDE DAMASCENE WIRES

FIELD OF THE INVENTION

The present invention relates to the field of integrated circuit manufacture; more specifically, it relates to a method of reducing critical dimension process bias differences between narrow and wide damascene wires.

BACKGROUND

As the dimensions of integrated circuit wiring has decreased, the difference between the process bias between narrow and wide wires has increased making control of the resistance of the wires difficult and reducing the performance of the integrated circuitry. Accordingly, there exists a need in the art to mitigate the deficiencies and limitations described hereinabove.

SUMMARY

A first aspect of the present invention is a method, comprising: forming an organic polymer layer on a semiconductor substrate; forming a patterned photoresist layer over the organic polymer layer, the patterned photoresist layer having a first opening and a second opening, the second opening wider than the first opening; performing a first reactive ion etch to transfer the pattern of the first and second openings into the organic polymer layer to form a first trench and a second trench in the organic polymer layer, the second trench wider than the first trench, the first trench extending into but not through the organic polymer layer, the second trench extending through the organic polymer to the semiconductor substrate, the first reactive ion etch forming a first polymer layer on sidewalls of the first trench and a second polymer layer on sidewalls of the second trench, the second polymer layer thicker than the first polymer layer; and performing a second reactive ion etch to extend the first trench through the organic polymer layer to the semiconductor substrate, the second reactive ion etch removing the second polymer layer from sidewalls of the second trench.

A second aspect of the present invention is a method, comprising: forming dielectric layer on a semiconductor substrate; forming an interlevel dielectric layer on the dielectric layer; forming hardmask layer on the interlevel dielectric layer; forming a silicon containing antireflective coating on the dielectric hardmask layer; forming a patterned photoresist layer over the antireflective coating, the patterned photoresist layer having a first opening and a second opening, the second opening wider than the first opening; performing a first reactive ion etch to transfer the pattern of the first and second openings into the antireflective coating to form a first trench and a second trench in the antireflective coating, the second trench wider than the first trench; performing a second reactive ion etch to extend the first trench and the second trench into the organic polymer layer, the first trench extending into but not through the organic polymer layer, the second trench extending through the organic polymer to the hardmask layer, the second reactive ion etch forming a first polymer layer on sidewalls of the first trench and a second polymer layer on sidewalls of the second trench, the second polymer layer thicker than the first polymer layer; performing a third reactive ion etch to extend the first trench through the organic polymer layer to the semiconductor substrate, the third reactive ion etch removing the second polymer layer from sidewalls of the second trench, the third reactive ion etch removing the patterned photoresist layer; performing a fourth reactive ion etch to extend the first and second trench through the interlevel dielectric layer to the interlevel dielectric layer; and performing a fifth reactive ion etch or a first plasma etch to remove the organic polymer layer.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

One method of reducing wire dimensions in integrated circuits is called shrinking, wherein all geometric dimensions of features of a previous integrated circuit design are uniformly shrunk (i.e., reduced) to generate a new design. However, because of the nature of the processes used, for some levels such a wiring levels, the completed wires are not uniformly shrunk, wherein wide wires shrink more than narrow wires. This is expressed as a difference in process bias between narrow and wide lines. One cause of this process bias non-uniformity is the non-uniform deposition of sidewall polymer during the trench formation step of forming damascene wires which results in etch bias non-uniformity between the narrow trenches and the wide trenches. The embodiments of the present invention address this cause of non-uniform process bias.

A damascene process is one in which wire trenches are formed in a dielectric layer and an electrical conductor of sufficient thickness to fill the trenches is deposited and/or plated in the trenches and on a top surface of the dielectric layer. A chemical-mechanical-polish (CMP) process is performed to remove excess conductor and make the surface of the conductor co-planar with the surface of the dielectric layer to form damascene wires.

A photolithographic process is one in which a photoresist layer is applied to a surface of a substrate, the photoresist layer exposed to actinic radiation through a patterned photomask and the exposed photoresist layer developed to form a patterned photoresist layer. When the photoresist layer comprises positive photoresist, the developer dissolves the regions of the photoresist exposed to the actinic radiation and does not dissolve the regions where the patterned photomask blocked (or greatly attenuated the intensity of the radiation) from impinging on the photoresist layer. When the photoresist layer comprises negative photoresist, the developer does not dissolve the regions of the photoresist exposed to the actinic radiation and does dissolve the regions where the patterned photomask blocked (or greatly attenuated the intensity of the radiation) from impinging on the photoresist layer.

After processing (e.g., an etch), the patterned photoresist is removed. Processing results in a physical change to the substrate. The photoresist layer may optionally be baked at one or more of the following steps: prior to exposure to actinic radiation, between exposure to actinic radiation and development, after development.

All reactive ion etch (RIE) process conditions are given for tools processing 300 mm diameter wafers.

FIGS. 1A through 1I are cross-sectional views illustrating fabrication of damascene wires according to a first embodiment of the present invention. The first embodiment is particularly useful when contact 110 (see FIG. 1A) does not include copper (Cu).

Figure 1A:
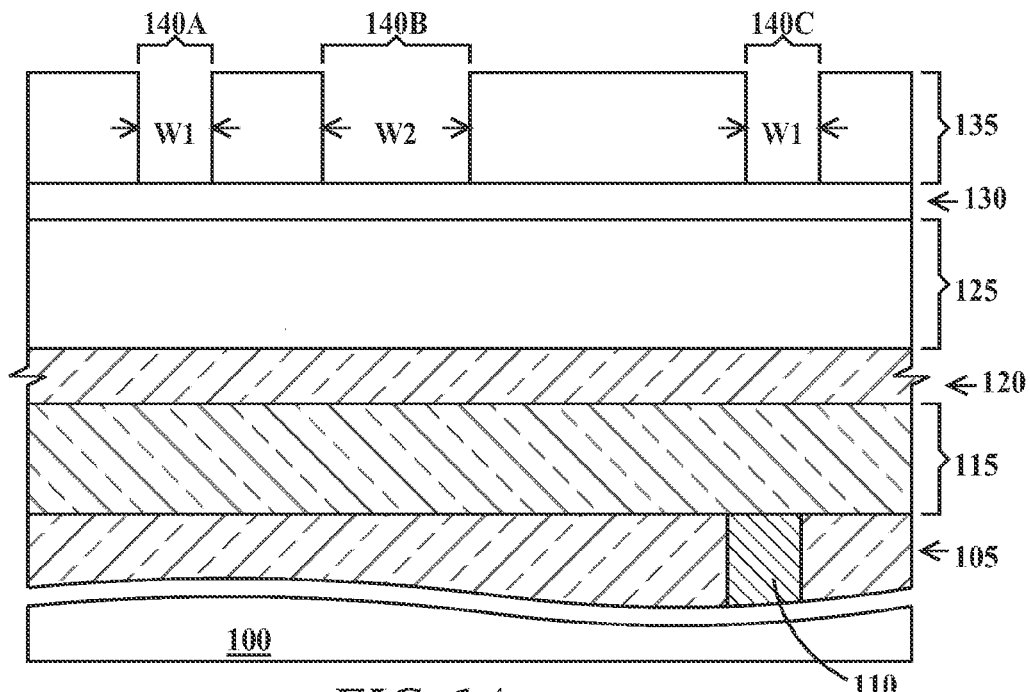
FIGS. 1A through 1I are cross-sectional views illustrating fabrication of damascene wires according to a first embodiment of the present invention.

In FIG. 1A, a semiconductor substrate 100 (e.g., a bulk silicon substrate or a silicon on insulator (SOI)) is provided. Substrate 100 includes devices such a field effect transistors (FETs) and bipolar transistors. Formed on substrate 100 is a contact dielectric layer 105 having an electrically conductive contact 110 formed therein. Contact 110 may be formed using a damascene process. An interlevel dielectric layer (ILD) 115 is formed on a top surface of contact dielectric layer 105. Contact 105 extends from a top surface of contact dielectric layer 105 through the contact dielectric layer to physically and electrically contact a device in substrate 100. Formed on a top surface of ILD 115 is a dielectric hardmask layer 120. Formed on a top surface of hardmask layer 120 is an organic polymer layer (OPL) 125. Formed on a top surface of OPL 125 is a SiARC (Si antireflective coating) 130. Formed on a top surface of SiARC 130 is a patterned photoresist layer 135 having narrow openings 140A and 14C and wide opening 140C formed therein. Regions of the top surface of SiARC 130 are exposed in the bottom of openings 140A, 140B and 140C. Alternatively, a titanium based ARC (TiARC) may be substituted for the SiARC, In one example, contact 110 comprises tungsten (W). In one example, contact dielectric layer 105 comprises $SiO_2$. In one example, ILD layer 115 is a low K (dielectric constant) material, examples of which include but are not limited to hydrogen silsesquioxane polymer (HSQ), methyl silsesquioxane polymer (MSQ), SiLK™ (polyphenylene oligomer) manufactured by Dow Chemical, Midland, Tex., Black Diamond™ (methyl doped silica or $SiO_x(CH_3)_y$ or $SiC_xO_yH_y$ or SiOCH) manufactured by Applied Materials, Santa Clara, Calif., organosilicate glass (SiCOH), and porous SiCOH. A low K dielectric material has a relative permittivity of about 2.7 or less. In one example, hardmask layer 120 is tetraethyl orthosilicate (TEOS) oxide. In one example, OPL 125 comprises polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques. In one example SiARC 130 comprises a silicon-containing ARC commercially available as Sepr-Shb Aseries SiARC from Shin Etsu Chemical Co., Ltd. which may be applied using spin coating technology or a vapor deposition process.

In one example ILD layer 115 is between about 50 nm and about 300 nm thick. In one example, hardmask layer 120 is about 10 nm to about 50 nm thick. In one example, OPL 125 is about 80 nm to about 350 nm thick. In one example, SiARC 130 is about 25 nm to about 100 nm thick. The width of openings 140A and 140C are W1 and the width of opening 140B is W2. In one example, W1 is about 30 nm to about 60 nm and W2 is about 60 nm to about 10000 nm or greater.

Figure 1B:
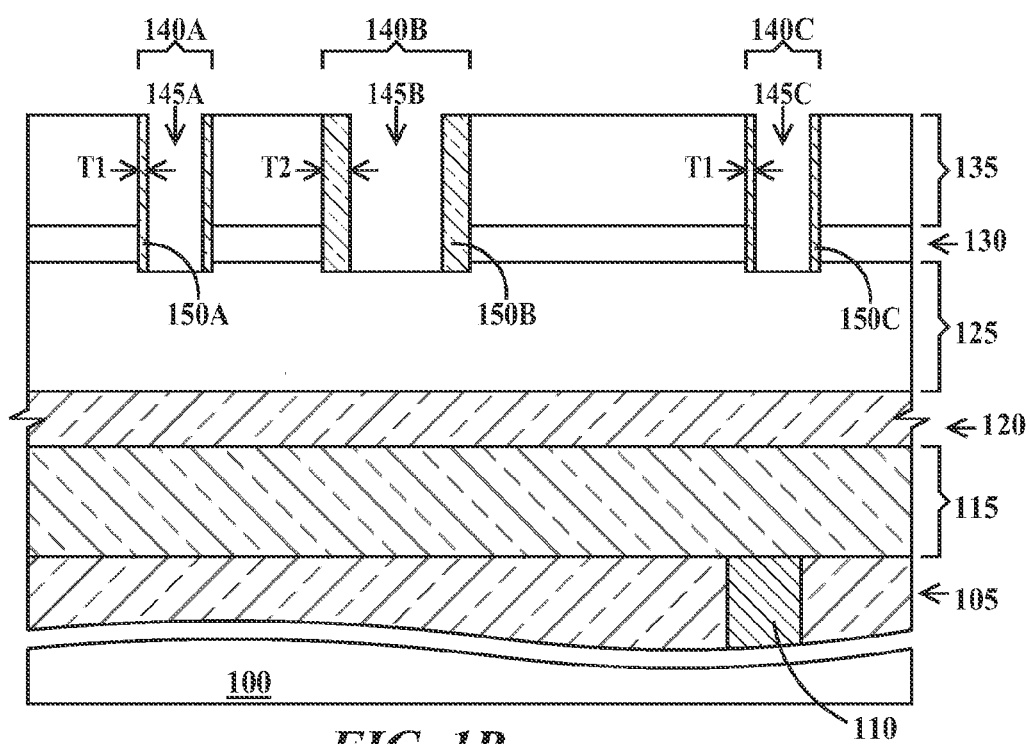

In FIG. 1B a SiARC RIE is performed. The SiARC RIE etches away any SiARC exposed in the bottom of openings 140A, 140B and 140C to form respective trenches 145A, 145B and 145C that extend into OPL 130. The SiARC RIE deposits polymer layers 150A, 150B and 150C on the sidewalls of respective trenches 145A, 145B and 145C. In one example, polymer layers 150A and 150C have a thickness T1 of about 2 nm to about 12 nm. Polymer layer 150B has a thickness T2 of about 6 mm to about 60 nm. It is critical to the operation of the present invention that the SiARC RIE be a polymer forming etch and that T2 be greater than T1. In one example T2 is about 3 times T1. In one example, the SiARC RIE comprises a first RIE of about 30 seconds at about 50 mTorr, with a forward power of about 800 watts and a DC bias of about 100 watts using $CF_4$ at about 145 sccm and $C_4F_8$ at about 25 sccm followed by a second RIE of about 18 seconds at about 50 mTorr, with a forward power of about 800 watts and a DC bias of about 150 watts using $CF_4$ at about 155 sccm and $C_4F_8$ at about 15 sccm.

Figure 1C:
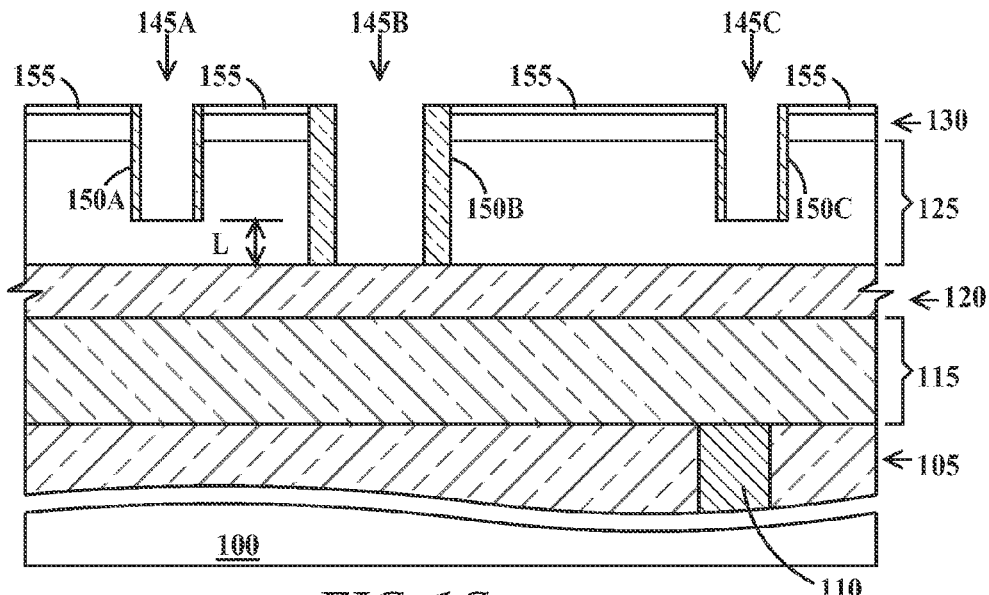

In FIG. 1C, a first OPL RIE is performed that (i) extends trenches 145A and 14C into OPL 125 but not all the way through OPL 125 (ii) etches trench 145B all the way through OPL 125 stopping on hardmask layer 120, (iii) removes photoresist layer 135 (see FIG. 1B) and (iv) forms an oxidized SiARC surface layer 155 on SiARC layer 130. It is critical to the operation of the present invention that the first OPL RIE etch wider trenches (i.e., trench 145B) faster than narrow trenches (i.e., trenches 145A and 145B) so as to introduce a lag L in the depth of etch into the OPL between wide and narrow trenches. In one example, the first OPL RIE includes a carbon containing species and does not include a fluorine containing species. In one example, the first OPL RIE comprises a RIE of about 18 seconds at about 10 mTorr, with a forward power of about 1000 watts and a DC bias of about 280 watts using $CO_2$ at about 190 sccm and $N_2$ at about 160 sccm. The low pressure is a contributing factor to the value of L. In one example, L is about 10 nm to about 50 nm. Hardmask layer 120 also acts as an etch stop for the first OPL RIE etch.

Figure 1D:
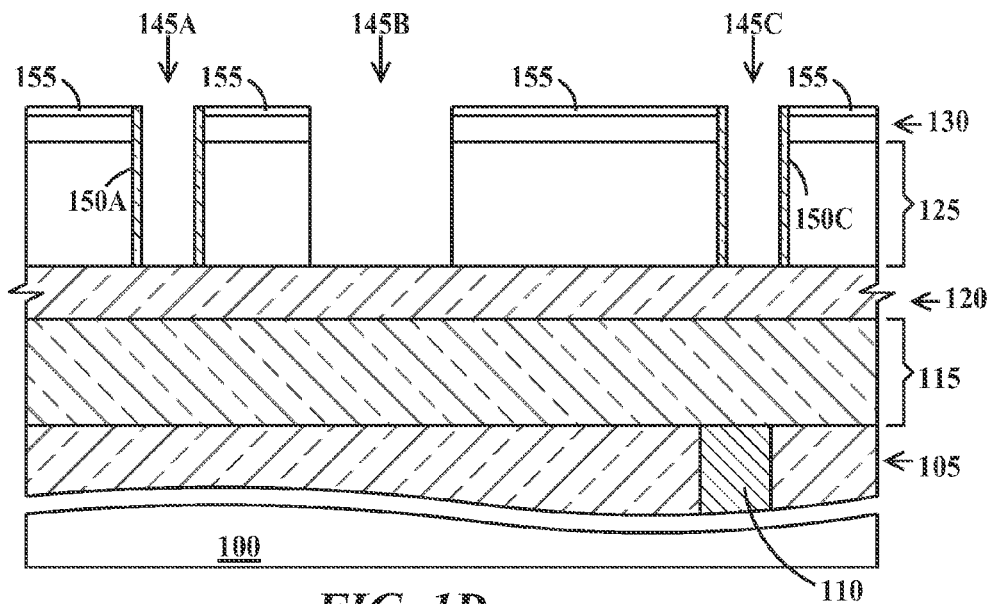

In FIG. 1D, a second OPL RIE is performed that (i) completes etching through OPL 125 to hardmask layer 120, (ii) removes polymer 150B from the sidewalls of trench 145B (the wide trench) and does not remove polymer 150A and 150C from the sidewalls of respective trenches 145A and 145C (the narrow trenches). It is critical to the operation of the present invention that the second OPL RIE etch creates none to minimal (e.g., no more than about 5 nm) sidewall polymer. The amount of sidewall polymer formed during the second OPL RIE etch is due to (i) the photoresist being removed by the first OPL RIE and the fact that the second OPL RIE uses a reducing chemistry. In one example, the second POL RIE does not include a carbon containing species and does not include a fluorine containing species. In one example, the second OPL RIE comprises a RIE of about 25 seconds at about 40 mTorr, with a forward power of about 1200 watts and a DC bias of about 200 watts using $N_2$ at about 210 sccm and $H_2$ at about 420 sccm. Hardmask layer 120 also acts as an etch stop for the second OPL RIE etch.

Figure 1E:
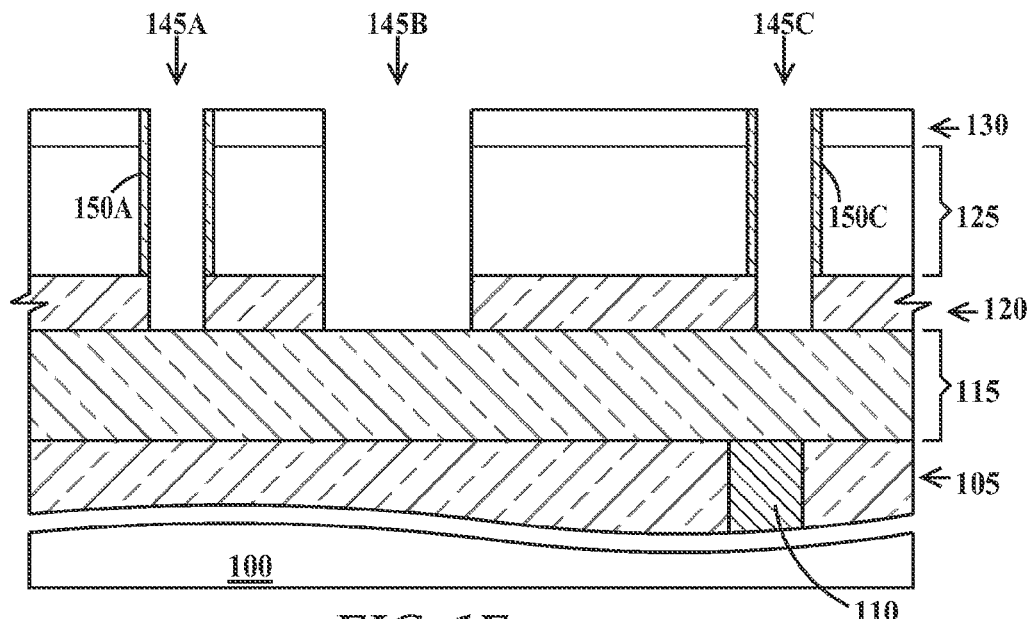

In FIG. 1E, a hardmask RIE is performed to extend trenches 145A, 145B and 145C through hardmask layer 120. The hardmask RIE also removes oxidized SiARC surface layer 155 (see FIG. 1D) from SiARC layer 130. In one example, the hardmask RIE comprises a RIE of about 30 seconds at about 40 mTorr, with a forward power of about 0 watts and a DC bias of about 500 watts using $CF_4$ at about 200 sccm and Ar at about 450 sccm. Since the forward power of the exemplary hardmask RIE is zero, through performed in an RIE tool, this etch is essentially a plasma etch. However, a true RIE (forward power greater than zero) may also be used.

Therefore the term hardmask RIE may be alternatively be read as hardmask plasma etch.

Figure 1F:
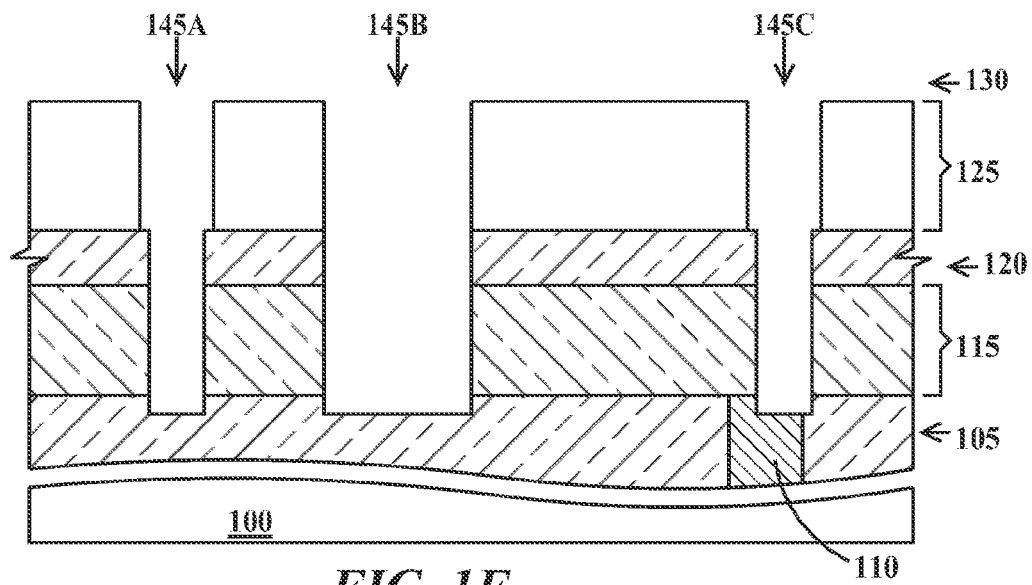

In FIG. 1F, an ILD RIE is performed to (i) extend trenches 145A, 145B and 145C through ILD layer 115 to contact dielectric 105, (ii) remove remaining SiARC (see FIG. 1E) and (iii) any remaining sidewall polymer. In one example, the ILD RIE comprises a RIE of about 20 seconds at about 40 mTorr, with a forward power of about 800 watts and a DC bias of about 1200 watts using $C_4F_8$ at about 8 sccm, Ar at about 1000 sccm and $N_2$ at about 100 sccm. After the ILD RIE, a recess RIE is performed to extend trenches 145A, 145B and 145C into but not through contact dielectric layer 105. The contact dielectric recess RIE also recesses contact 110 in the bottom of trench 145C. In one example, the recess RIE comprises a RIE of about 25 seconds at about 40 mTorr, with a forward power of about 800 watts and a DC bias of about 100 watts using $CF_4$ at about 300 sccm, Ar at about 400 sccm and CO at about 80 sccm. The recess RIE is then followed by a de-fluorinating RIE to remove residual fluorine left by the previous fluorine containing RIEs, particularly the ILD RIE and recess RIE. In one example, the de-fluorinating RIE comprises a RIE of about 10 seconds at about 50 mTorr, with a forward power of about 300 watts and a DC bias of about 0 watts using $CO_2$ at about 600 sccm.

Figure 1G:
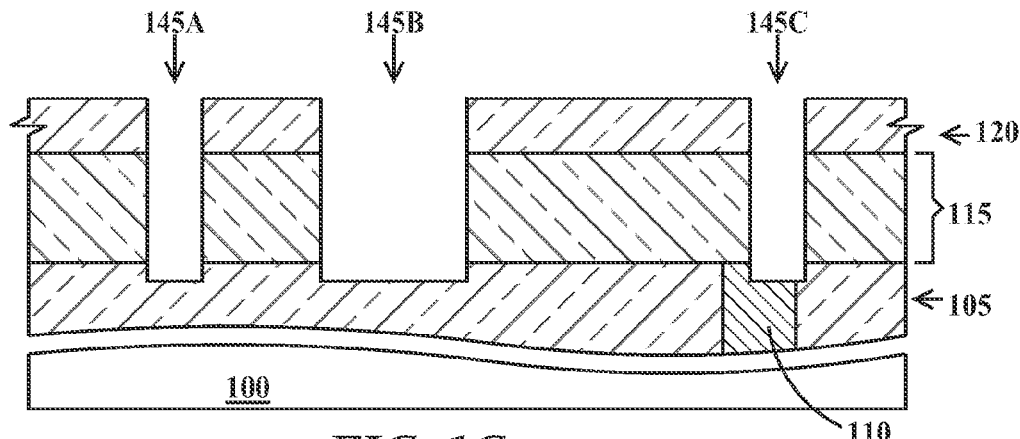

In FIG. 1G, an OPL removal RIE is performed to remove any remaining OPL 125 (see FIG. 1F). In one example, the OPL removal RIE comprises a RIE of about 50 seconds at about 90 mTorr, with a forward power of about 0 watts and a DC bias of about 500 watts using $CO_2$ at about 750 sccm. Since the forward power of the exemplary OPL removal RIE is zero, through performed in an RIE tool, this etch is essentially a plasma etch. However, a true RIE (forward power greater than zero) may also be used. Therefore the term OPL removal RIE may be alternatively be read as OPL removal plasma etch.

Figure 1H:
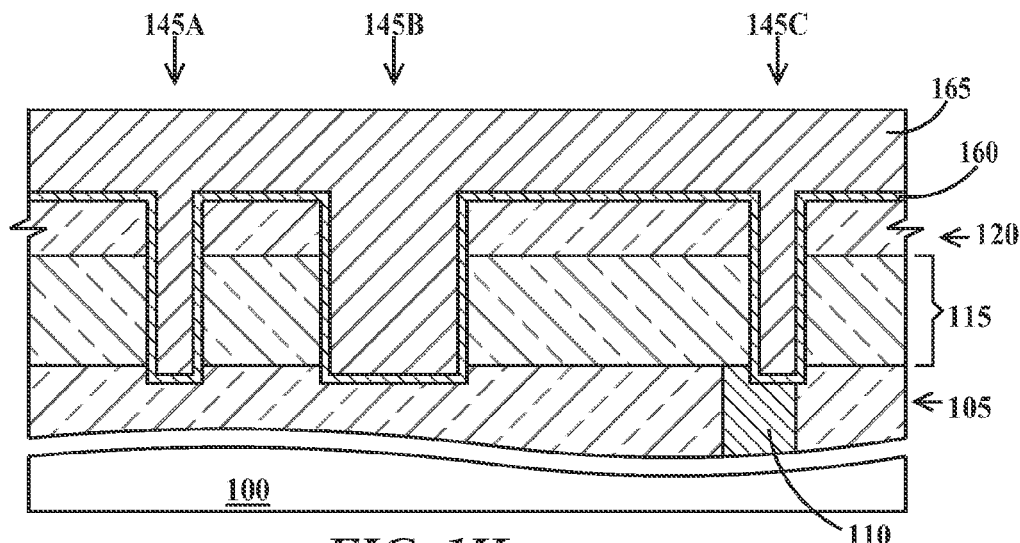

In FIG. 1H, a conformal electrically conductive liner layer 160 is formed on the sidewalls of trenches 145A, 145B and 145C and on top surfaces of hardmask layer 120. Then a copper layer 165 is formed on the liner layer 160, filling trenches 145A, 145B and 145C. In one example, liner layer 160 comprises a first deposited tantalum nitrite (TaN) layer and a second deposited tantalum (Ta) layer. In one example, liner layer 160 comprises a first deposited titanium nitrite (TiN) layer and a second deposited titanium (Ti) layer. In one example copper layer 165 is formed by first evaporating a thin Cu seed layer on liner 160 followed by electroplating Cu to fill trenches 145A, 145B and 145C.

Figure 1I:
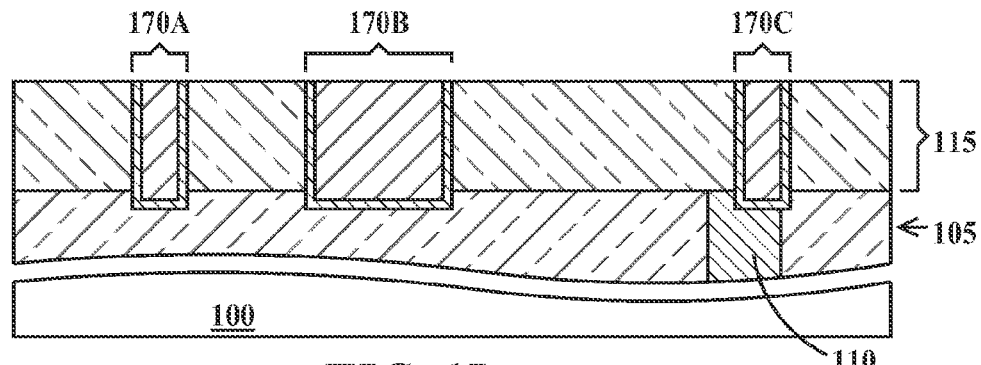

In FIG. 1I, a chemical-mechanical-polish (CMP) is performed to remove liner layer 160, copper layer 165 and hardmask layer 120 (see FIG. 1H) to form damascene wires 170A, 170B and 170C in ILD layer 115. After CMP, top surfaces of wires 170A, 170B and 170C are coplanar with top surfaces of ILD layer 115. Wires 170A, 170B and 170C each comprise an electrically conductive liner 175 and a copper core conductor 180. Wire 170C is illustrated in physical and electrical contact with contact 110.

FIGS. 2A through 2I are cross-sectional views illustrating fabrication of damascene wires according to a second embodiment of the present invention. The second embodiment differs from the first embodiment only in that a copper diffusion barrier layer 180 (see FIG. 2A) is formed between contact dielectric layer 105 and ILD layer 115. The second embodiment is particularly useful when contact 110 (see FIG. 2A) includes Cu; however the second embodiment may also be used when contact 110 does not contain Cu.

Figure 2A:
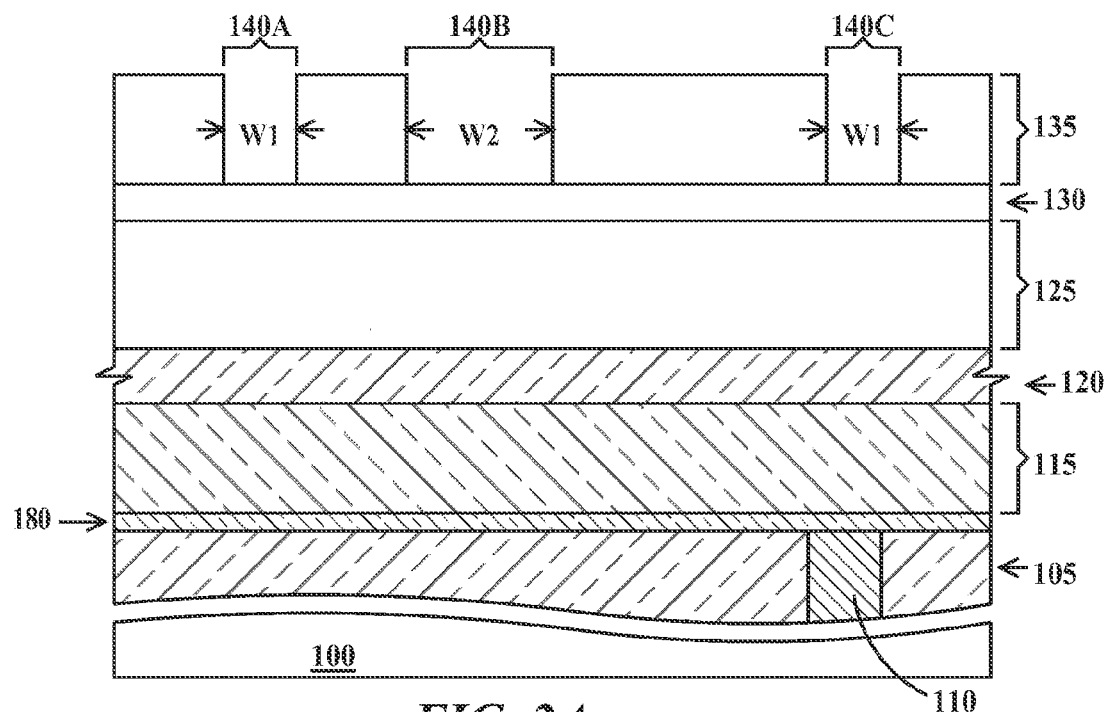
FIGS. 2A through 2I are cross-sectional views illustrating fabrication of damascene wires according to a second embodiment of the present invention.
Figure 2B:
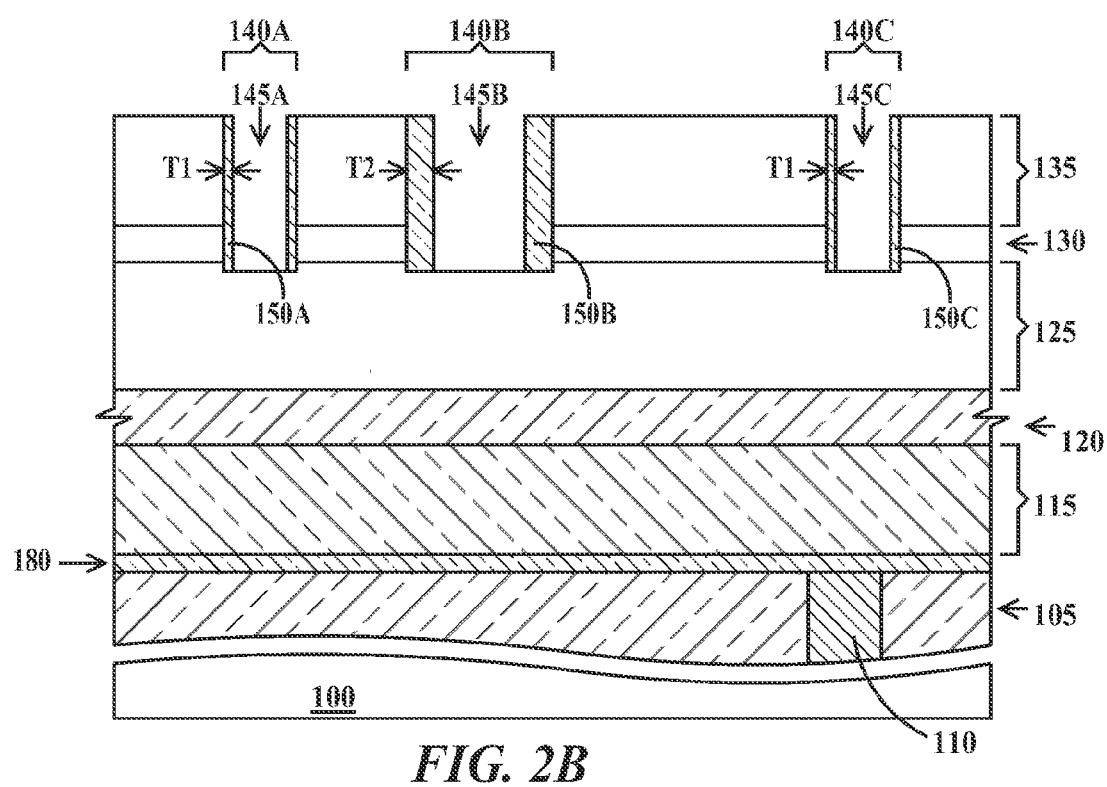
Figure 2C:
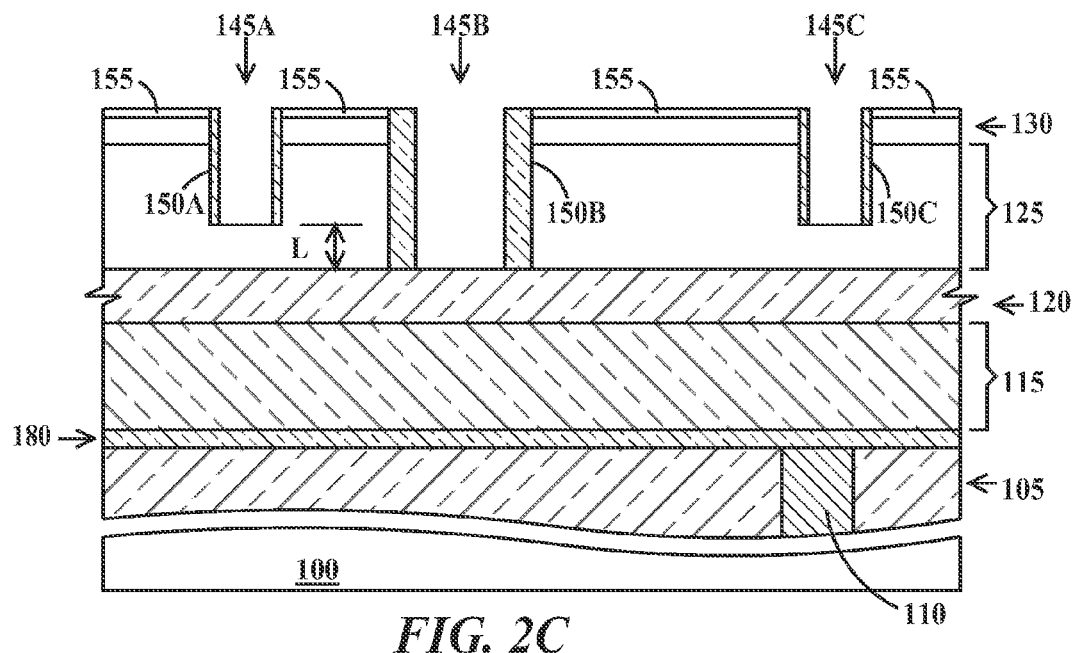
Figure 2D:
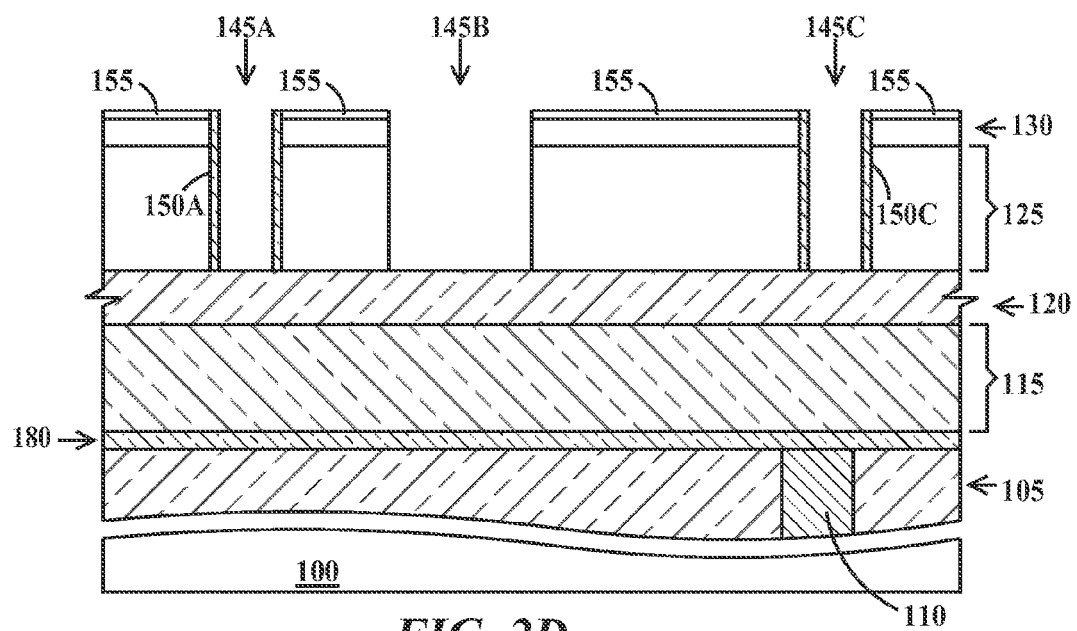

FIG. 2A is similar to FIG. 1A except that a barrier layer 180 is formed between contact oxide layer 105 and ILD layer 115. Barrier layer 180 acts a diffusion barrier to Cu. In one example, barrier layer 180 is about 20 nm to about 40 nm thick. In one example, barrier layer 180 comprises silicon nitride ($Si_3N_4$), silicon carbide (SiC), silicon oxy nitride (SiON), silicon oxy carbide (SiOC), organosilicate glass (Si-COH), plasma-enhanced silicon nitride ($PSiN_x$) or NBLok (SiC(N,H)).

FIGS. 2B, 2C, 2D, 2E are similar to respective FIGS. 1B, 1C, 1D and 1E.

Figure 2E:
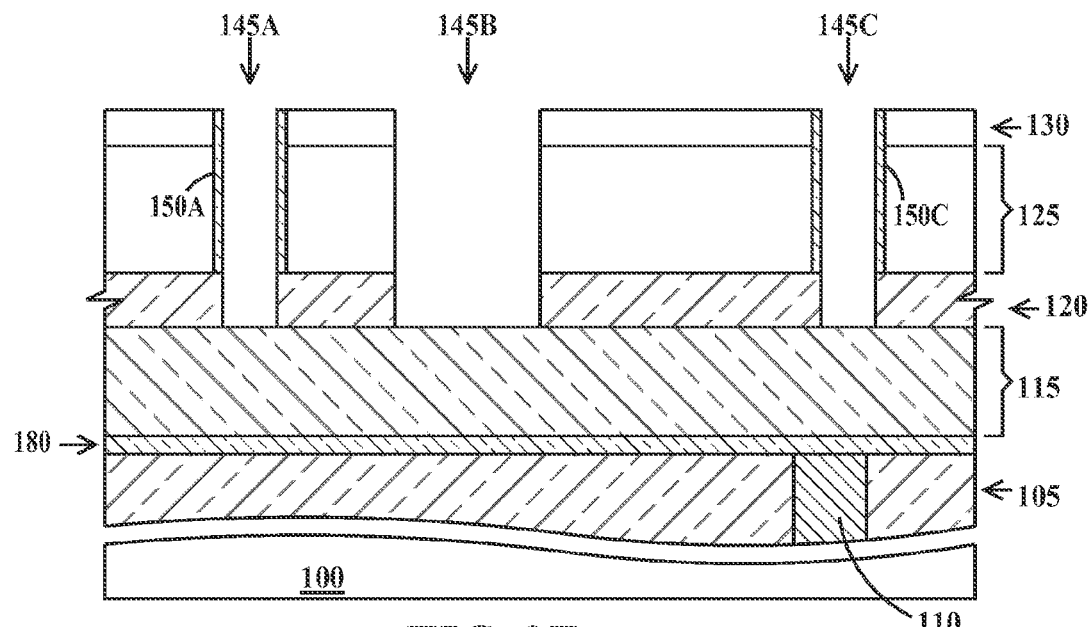
Figure 2F:
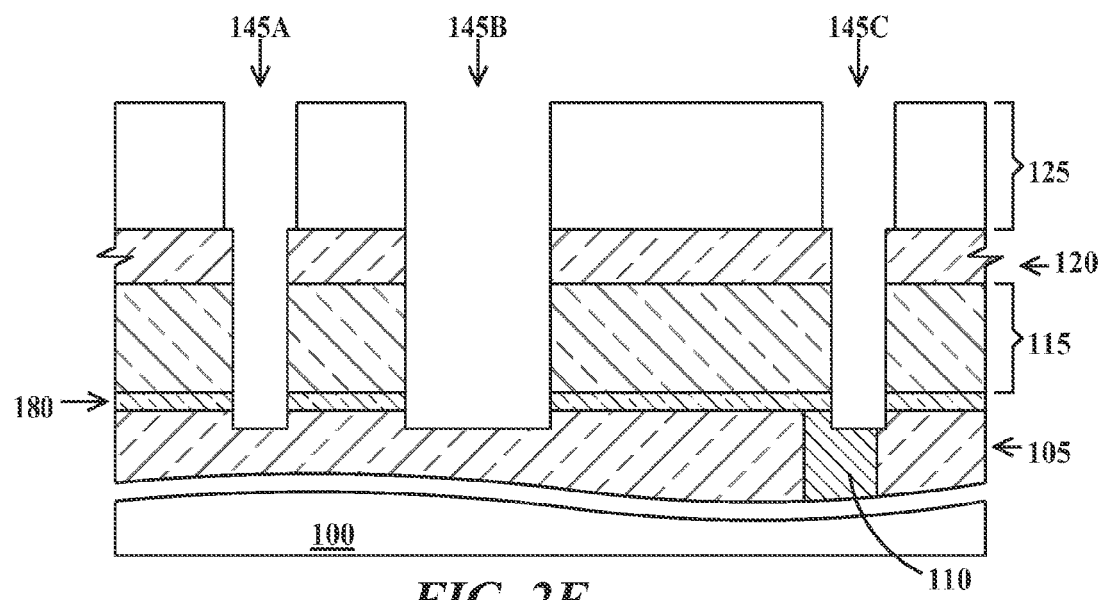

In FIG. 2F, an ILD/Barrier RIE is performed to (i) extend trenches 145A, 145B and 145C through ILD layer 115 and through barrier layer 180 to contact dielectric 105, (ii) remove remaining SiARC (see FIG. 2E) and (iii) any remaining sidewall polymer. In one example, the ILD/Barrier RIE comprises a RIE of about endpoint detect time plus 10 seconds at about 40 mTorr, with a forward power of about 400 watts and a DC bias of about 1200 watts using $C_4F_8$ at about 8 sccm, Ar at about 1200 sccm and $N_2$ at about 100 sccm. After the ILD/Barrier RIE, a contact dielectric recess RIE is performed to extend trenches 145A, 145B and 145C into but not through contact dielectric layer 105. The contact dielectric recess RIE also recesses contact 110 in the bottom of trench 145C. In one example, the contact dielectric recess RIE comprises a RIE of about 10 seconds at about 40 mTorr, with a forward power of about 800 watts and a DC bias of about 100 watts using $CF_4$ at about 300 sccm and CO at about 80 sccm. The contact dielectric recess RIE is then followed by a de-fluorinating RIE to remove residual fluorine left by the previous fluorine containing RIEs. In one example, the de-fluorinating RIE comprises a RIE of about 10 seconds at about 50 mTorr, with a forward power of about 300 watts and a DC bias of about 0 watts using $CO_2$ at about 600 sccm.

Figure 2G:
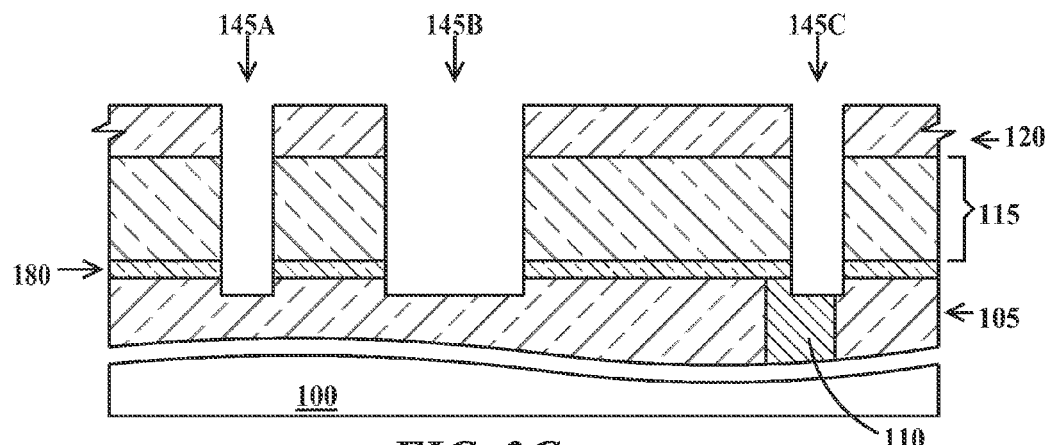
Figure 2H:
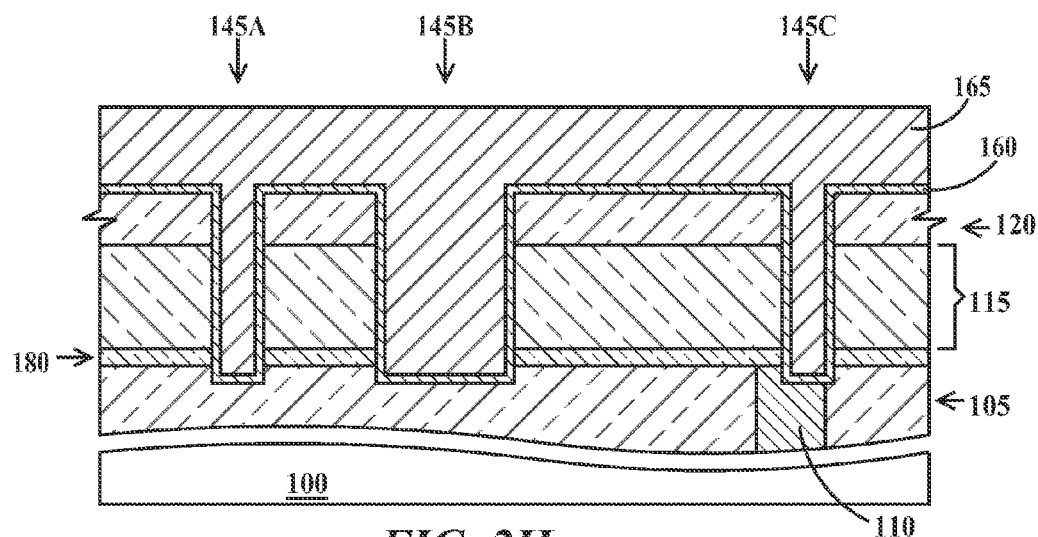
Figure 2I:
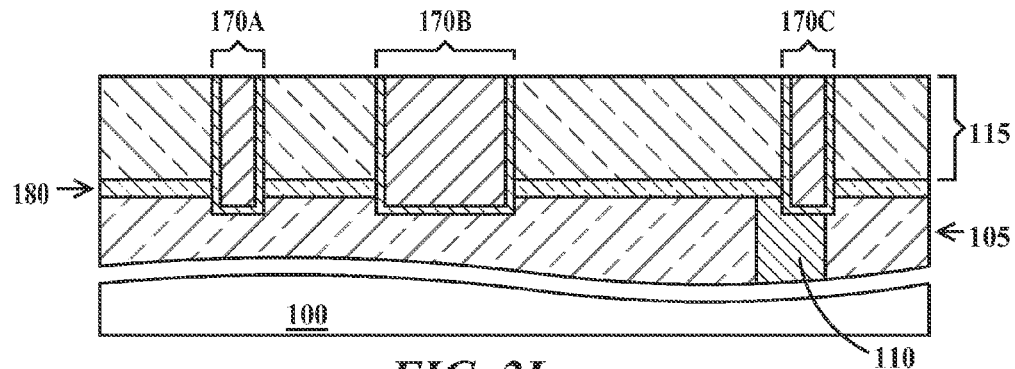

FIGS. 2G, 2H and 2I are similar to respective FIGS. 1G, 1H and 1I.

Figure 3:
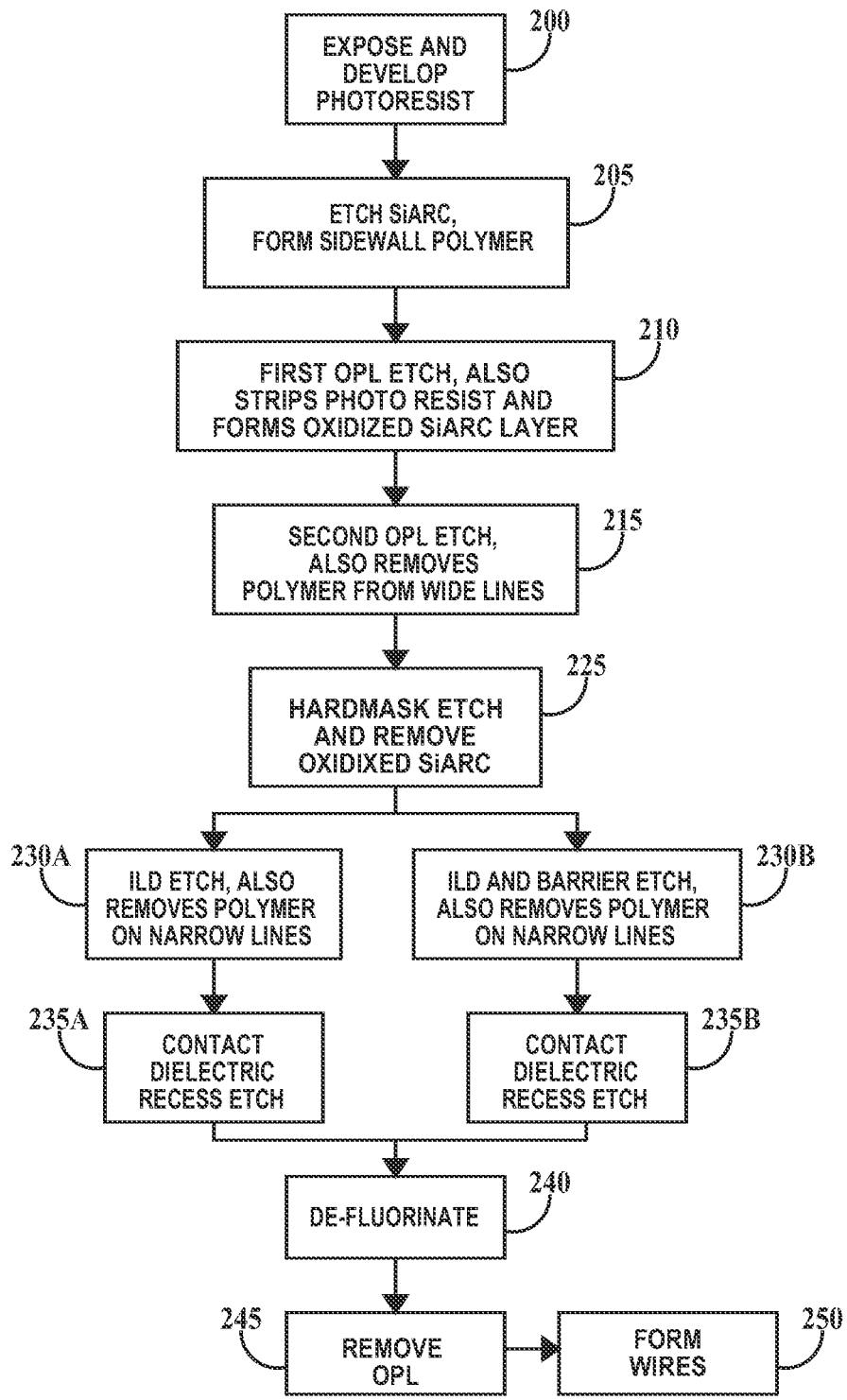
FIG. 3 is a flowchart of the method of fabricating damascene wires according to embodiments of the present invention.

FIG. 3 is a flowchart of the method of fabricating damascene wires according to embodiments of the present invention. In step 200, a photoresist layer applied on SiARC layer 130 over the polymer/dielectric stack of FIG. 1A or 2A and is patterned into narrow and wide openings using, for example, immersion lithography. In immersion lithography, a liquid (e.g., water) is placed between the final lens of the photolithography tool and the top surface of the photoresist layer. In one example, a wide opening has a width of about 3 times or greater than a width of the widest narrow opening. In one example, a wide opening has a width of about 3 times or greater than a width (called an anchor width) of the narrowest opening.

In step 205, the SiARC layer is etched and polymer formed on the sidewalls of the photoresist opening and a trench etched through the SiARC layer. The sidewall polymer is thicker on wide trenches than narrow trench. In general, the wider the trench, the thicker the polymer though after a particular width, the polymer thickness tends to no longer increase to any measurable extent. The SiARC etch may be a single or multiple step RIE. A two step SiARC etch is preferred, so as to reduce the overetch (recessing) of OPL layer 125 (see FIG. 1B or 2B).

In step 210, the first OPL RIE is performed which extends the trenches into the OPL 125. Wide lines, as defined supra, etch through OPL 125 to hardmask layer 120 while narrow lines, as defined supra, etch only partially through OPL 125. The first OPL RIE also removes the photoresist layer and oxidizes a top surface of the SiARC (155). That there be a region of OPL layer 125 between the narrow lines and hardmask layer 120 is critical to the operation of the invention, because this allows changing to a chemistry for finishing the OPL etch in the narrow trenches while removing the polymer from the wide trenches, restoring the width of the wide trenches back to that of the wide photoresist openings or wider. Hardmask layer 120 acts as an etch stop layer for the first OPL RIE. See FIGS. 1C and 2C.

In step 215, the second OPL RIE is performed which extends the narrow trenches through OPL 125 to hardmask layer 120. The etch chemistry of the second OPL RIE is critical to the operation of the present invention in that not only must it not form none to little sidewall polymer, but must also be able to remove most to all of the polymer already formed on the sidewalls of the wide trenches by the previous RIE etches. To this end, it is preferred that the second OPL RIE chemistry contain no carbon or fluorine and it is further preferred that it contain a species derived from a reducing gas such as, but not limited to, hydrogen.

In step 225a hardmask RIE is performed which extends the wide and narrow trenches through hardmask layer 120 to ILD layer 115 and also removes the oxidized SiARC 155. See FIG. 1E or 2E.

The method proceeds to steps 230A and 235A if there is not a barrier layer 180 (FIG. 1E) or to steps 230B and 235B if there is a barrier layer 180 (FIG. 2E). In step 230A, an ILD RIE to etch through ILD layer 115 followed by a recess RIE in step 235A to extend the wide and narrow trenches into contact dielectric layer 105. See FIG. 1F. In step 230B, an ILD/Barrier RIE to etch through ILD layer 115 and barrier layer 180 followed by a recess RIE in step 235B to extend the wide and narrow trenches into contact dielectric layer 105. See FIG. 2F.

After step 235A or 235B the method proceeds to step 240 where a de-fluorinating RIE is performed to remove residual fluorine left by the previous fluorine containing RIEs. In step 245, an OPL removal RIE (or plasma etch) is performed to remove OPL layer 125. See FIG. 1G or 2G. In step 250 damascene wires are formed in the narrow and wide trenches.

The anchor width is the width of the target line in the shrunk design that corresponds to the target line in the un-shrunk or original design which is wider. When the original target line is shrunk by X %, all lines regardless of width are expected to shrink by X %. However, in practice wider lines shrink greater than X %. The embodiments of the present invention bring the shrink percentage of both anchor and wide lines closer to X %. This can be measured by comparing the critical dimension (CD) bias of narrow and wide lines. Table I illustrates the target image size versus actual image size (at mid trench) and CD bias obtained from a test structure after removing OPL 125.

TABLE I

| Target (nm) | Actual (nm) | CD Bias (nm) |
|---|---|---|
| 50 | 49 | −1 |
| 75 | 79 | 4 |
| 100 | 104 | 4 |
| 150 | 152 | 2 |
| 1000 | 1006 | 6 |

Table I illustrates that across a wide range of trench widths the CD bias is about the same.

Thus, the embodiments of the present invention provides a method to reduce the etch bias difference component of the process bias difference between narrow and wide damascene wires by decoupling the etch shrink behavior between narrow and wide wire trenches.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   forming an organic polymer layer on a semiconductor substrate;
   forming a patterned photoresist layer over said organic polymer layer, said patterned photoresist layer having a first opening and a second opening, said second opening wider than said first opening;
   performing a first reactive ion etch to transfer the pattern of said first and second openings into said organic polymer layer to form a first trench and a second trench in said organic polymer layer, said second trench wider than said first trench, said first trench extending into but not through said organic polymer layer, said second trench extending through said organic polymer to said semiconductor substrate, said first reactive ion etch forming a first polymer layer on sidewalls of said first trench and a second polymer layer on sidewalls of said second trench, said second polymer layer thicker than said first polymer layer; and
   performing a second reactive ion etch to extend said first trench through said organic polymer layer to said semiconductor substrate, said second reactive ion etch removing said second polymer layer from sidewalls of said second trench.

2. The method of claim 1, further including:
   said first reactive ion etch removing said patterned photoresist layer.

3. The method of claim 1, further including:
   performing a third reactive ion etch to extend said first and second trenches into said semiconductor substrate; and
   performing a fourth reactive ion etch to remove said organic polymer layer.

4. The method of claim 1, wherein said second reactive ion etch does not remove said first polymer layer from sidewalls of said first trench.

5. The method of claim 1, wherein said second reactive ion etch contain a species derived from a reducing gas including hydrogen.

6. The method of claim 1, wherein said first reactive ion etch includes a carbon containing species and does not contain a fluorine containing species.

7. The method of claim 6, wherein said first reactive ion etch includes species derived from carbon dioxide and nitrogen.

8. The method of claim 1, wherein said second reactive ion etch does not include a carbon containing species and does not include a fluorine containing species.

9. The method of claim 8, wherein said first reactive ion etch includes species derived from nitrogen and hydrogen.

10. A method, comprising:
    forming dielectric layer on a semiconductor substrate;
    forming an interlevel dielectric layer on said dielectric layer;
    forming hardmask layer on said interlevel dielectric layer;
    forming an organic polymer layer on said hardmask layer;
    forming a silicon containing antireflective coating on said organic polymer layer;

forming a patterned photoresist layer over said silicon containing antireflective coating, said patterned photoresist layer having a first opening and a second opening, said second opening wider than said first opening;

performing a first reactive ion etch to transfer the pattern of said first and second openings into said silicon containing antireflective coating to form a first trench and a second trench in said silicon containing antireflective coating, said second trench wider than said first trench;

performing a second reactive ion etch to extend said first trench and said second trench into said organic polymer layer, said first trench extending into but not through said organic polymer layer, said second trench extending through said organic polymer to said hardmask layer, said second reactive ion etch forming a first polymer layer on sidewalls of said first trench and a second polymer layer on sidewalls of said second trench, said second polymer layer thicker than said first polymer layer, said second reactive ion etch removing said patterned photoresist layer;

performing a third reactive ion etch to extend said first trench through said organic polymer layer to said semiconductor substrate, said third reactive ion etch removing said second polymer layer from sidewalls of said second trench;

performing a fourth reactive ion etch to extend said first trench and second trench through said hardmask layer to said interlevel dielectric layer;

performing a fifth reactive ion etch to extend said first and said second trench through said interlevel dielectric layer; and removing said organic polymer layer.

11. The method of claim 10, wherein said organic polymer layer is removed using a sixth reactive ion etch or a plasma etch.

12. The method of claim 10, further including:
after said fourth reactive ion etch and before said fifth reactive ion etch, performing a reactive ion etch process to remove fluorine left in said interlevel dielectric layer by said fourth reactive ion etch.

13. The method of claim 10, wherein said third reactive ion etch does not remove said first polymer layer from sidewalls of said first trench.

14. The method of claim 10, wherein said second reactive ion etch contain a species derived from a reducing gas including hydrogen.

15. The method of claim 10, wherein said interlevel dielectric is a low K material.

16. The method of claim 10, wherein said organic polymer layer is a low K material selected from the group consisting of hydrogen silsesquioxane polymer, methyl silsesquioxane polymer, polyphenylene oligomer, methyl doped silica, organosilicate glass, SiCOH, and porous SiCOH.

17. The method of claim 10, wherein a critical dimension bias of said first trench and a critical dimension bias of said second trench after said fifth reactive ion etch are about the same.

18. The method of claim 10, wherein said second reactive ion etch includes a carbon containing species and does not contain a fluorine containing species.

19. The method of claim 18, wherein said second reactive ion etch includes species derived from carbon dioxide and nitrogen.

20. The method of claim 10, wherein said third reactive ion etch does not include a carbon containing species and does not include a fluorine containing species.

21. The method of claim 20, wherein said second reactive ion etch includes species derived from nitrogen and hydrogen.

22. The method of claim 10, further including:
forming an electrically conductive liner layer on the bottom and sidewalls of said first and second trenches and on a top surface of said hardmask layer;

forming an electrically conductive core conductor layer on said electrically conductive liner layer; and performing a chemical-mechanical-polish to remove regions of said electrically conductive liner layer, said electrically conductive core layer and all of said hardmask layer to form first and second damascene wires in respective said first and second trenches, after said chemical-mechanical-polish top surfaces of said first and second damascene wires are coplanar with a top surface of said interlevel dielectric layer.

23. The method of claim 22, wherein at least said first or said second damascene wire is in electrical and physical contact with an electrically conductive third damascene wire in said dielectric layer.

24. The method of claim 10, wherein said interlevel dielectric layer comprises a barrier layer on a top surface of said dielectric layer and a low-K dielectric layer on a top surface of said barrier layer, said barrier layer preventing copper diffusion through said barrier layer.

25. The method of claim 24, wherein said barrier layer comprises silicon nitride, silicon carbide, silicon oxy nitride, silicon oxy carbide, organosilicate glass, plasma-enhanced silicon nitride or SiC(N,H).

* * * * *